United States Patent
Kapadia

(10) Patent No.: US 9,030,008 B2
(45) Date of Patent: May 12, 2015

(54) ADHESION PROMOTING COMPOSITION FOR METAL LEADFRAMES

(71) Applicant: MacDermid Acumen, Inc., Waterbury, CT (US)

(72) Inventor: Nilesh Kapadia, Shelton, CT (US)

(*) Notice: Subject to any disclaimer, the term of this patent is extended or adjusted under 35 U.S.C. 154(b) by 59 days.

(21) Appl. No.: 13/954,328

(22) Filed: Jul. 30, 2013

(65) Prior Publication Data

US 2013/0312635 A1  Nov. 28, 2013

Related U.S. Application Data

(62) Division of application No. 13/018,668, filed on Feb. 1, 2011, now Pat. No. 8,524,540.

(51) Int. Cl.
| | | |
|---|---|---|
| C09D 5/00 | (2006.01) | |
| C09J 5/02 | (2006.01) | |
| C09K 13/06 | (2006.01) | |
| H01L 23/31 | (2006.01) | |
| H01L 23/495 | (2006.01) | |
| C23F 1/18 | (2006.01) | |

(52) U.S. Cl.
CPC ... *C09D 5/00* (2013.01); *C09J 5/02* (2013.01); *C09J 2400/163* (2013.01); *C09J 2400/166* (2013.01); *C09J 2400/226* (2013.01); *C09K 13/06* (2013.01); *H01L 23/3142* (2013.01); *H01L 23/49586* (2013.01); *C23F 1/18* (2013.01); *H01L 2924/0002* (2013.01)

(58) Field of Classification Search
CPC .................................... C09K 13/06
USPC .................................... 252/79.2
See application file for complete search history.

(56) References Cited

U.S. PATENT DOCUMENTS

| | | |
|---|---|---|
| 4,359,348 A | 11/1982 | Crotty |
| 5,449,951 A | 9/1995 | Parthasarathi et al. |
| 5,540,378 A | 7/1996 | Mahulikar et al. |
| 5,942,052 A | 8/1999 | Kamimura et al. |
| 6,242,513 B1 | 6/2001 | Zhou et al. |
| 6,419,784 B1 | 7/2002 | Ferrier |
| 6,554,948 B1 | 4/2003 | Ferrier |
| 7,049,683 B1 | 5/2006 | Sirinorakul et al. |
| 7,078,809 B2 | 7/2006 | Yap et al. |
| 7,205,180 B1 | 4/2007 | Sirinorakul et al. |
| 7,250,391 B2 | 7/2007 | Kanno et al. |
| 7,327,017 B2 | 2/2008 | Sirinorakul et al. |
| 7,704,562 B2 | 4/2010 | Cordani, Jr. |
| 7,745,384 B2 | 6/2010 | Perry et al. |
| 2002/0108678 A1 | 8/2002 | Montano et al. |
| 2003/0203635 A1* | 10/2003 | Wang et al. ............... 438/692 |
| 2005/0090104 A1 | 4/2005 | Yang et al. |
| 2006/0097366 A1 | 5/2006 | Sirinorakul et al. |
| 2007/0001319 A1 | 1/2007 | Bauer et al. |
| 2009/0197786 A1 | 8/2009 | Perry et al. |
| 2010/0108942 A1 | 5/2010 | Man et al. |
| 2010/0255121 A1 | 10/2010 | Perry |

FOREIGN PATENT DOCUMENTS

| | | |
|---|---|---|
| CN | 1527747 | 9/2004 |
| CN | 101356260 | 1/2009 |

* cited by examiner

*Primary Examiner* — Evan Pert
(74) *Attorney, Agent, or Firm* — Carmody Torrance Sandak & Hennessey LLP

(57) ABSTRACT

A process for increasing the adhesion of a polymeric material to a metal surface, the process comprising contacting the metal surface with an adhesion promoting composition comprising: 1) an oxidizer; 2) an inorganic acid; 3) a corrosion inhibitor; and 4) an organic phosphonate; and thereafter b) bonding the polymeric material to the metal surface. The organic phosphonate aids in stabilizing the oxidizer and organic components present in the bath and prevents decomposition of the components, thereby increasing the working life of the bath, especially when used with copper alloys having a high iron content.

9 Claims, No Drawings

ADHESION PROMOTING COMPOSITION FOR METAL LEADFRAMES

CROSS REFERENCE TO RELATED APPLICATIONS

This application is a divisional of application Ser. No. 13/018,668, filed Feb. 1, 2011, now pending, the subject matter of which is incorporated by reference in its entirety.

FIELD OF THE INVENTION

The present invention relates generally to an improved adhesion promoting composition for metal substrates, such as copper and copper alloy substrates.

BACKGROUND OF THE INVENTION

Microelectronic circuits such as silicon semiconductor integrated circuits (IC) and hybrid microelectronic circuits require a package which both encases the circuit and provides electrical interconnection to external circuitry. A leadframe is one common means of electrical interconnection. The leadframe is formed from a strip of electrically conductive metal which is formed into a plurality of leads. The inner lead ends of the leadframe approach the integrated circuit device from one or more sides and are electrically interconnected to the device by thin bond wires. The outer lead ends of the leadframe are electrically interconnected to external circuitry such as a printed circuit board.

A leadframe can contain several units, depending on the size of the individual components and the lead frame size. The process of building a lead frame chip package involves forming the metal lead frame, selectively silver plating the die attach and wirebond pads, attaching the die (chip) to the lead frame with an epoxy adhesive, connecting the die to the leads of the metal frame by wirebonding conductive (e.g., gold) wires between the die and leads, encapsulating the package in an epoxy molding compound and then separating the individual units from the lead frame (singulation). These process steps may require high temperatures and physical handling, all of which produce internal stresses on the package as it is assembled. In addition, the integrity of the package depends on adhesion of the various components to the surface to which they are attached.

In addition, the electronics industry is moving towards the use of lead-free plating material for plating IC leadframes. Combinations such as nickel-palladium-gold (NiPdAu) are replacing prior art tin-lead (SnPb) solders. Because of the use of these new lead-free plating materials, a number of new temperature/moisture related issues have arisen, most of them linked to the elevated reflow temperatures required to form acceptable lead-free solder joints. Eutectic solder reflow temperatures are typically in the 200° C. to 215° C. range, while the new lead-free solders require reflowing temperatures in the 240° C. to 250° C. range. This 30-40° C. increase in reflow temperature for lead-free solders has had a wide ranging effect throughout the electronics production supply chain and has affected virtually every material and component used to manufacture a printed circuit board assembly (PCBA).

Moisture content in IC leadframe packages has been a defect and reliability issue for quite some time but recently, as assemblers increase reflow temperatures to accommodate lead-free solder reflow requirements, the matter of moisture related defects has been compounded since the vapor pressures in a package have increased exponentially with these elevated reflow temperatures.

To protect the device from moisture and mechanical damage, the inner lead ends and the device are encapsulated. Encapsulation may be by a molding resin which surrounds both the inner leads and the integrated circuit device. Alternatively, discrete base and cover components define a cavity. When the base and cover are bonded together, the inner lead ends and integrated circuit device are encapsulated within that cavity.

Vapor pressure, caused by the varying degrees of moisture within a given package turning to water vapor, builds during reflow and once it reaches a pressure level exceeding the chemical and/or mechanical bond strengths of the materials used to form the IC leadframe package, it releases through the path of least resistance.

Good adhesion of the inner lead ends to the molding resin is required to prevent the egress of water along the leads. Moisture can corrode the bond wires and the integrated circuit device. Additionally, the moisture accumulates inside the package. When heated, the moisture expands as steam, swelling and potentially cracking the package (i.e., "popcorning"). When discrete base and cover components are utilized, the mid-portion of the leadframe is bonded to both the base and to the cover with a thermosetting epoxy or a low temperature sealing glass. Good adhesion is required to prevent the egress of moisture.

Popcorn cracks, or "popcorning" as it is often called, earned this interesting moniker via the audible popping sound made when the vapor pressure in the component is released. Popcorn cracks are almost always large and can cause significant internal damage within the package. In many cases the defects are so large that electrical interconnects are broken, rendering the component non functional. This effect has both a good side and a bad side. The good side is that the defects can likely be identified during in-circuit testing (ICT) testing after assembly and do not escape to the field. The negative side is that a typical PCBA process requires expensive rework processes to replace the component.

A less volatile, but an equally concerning IC leadframe defect is called "delamination." This defect has the same root cause as popcorning, i.e. vapor pressure, but has more potential for latent defects and field failures. When delamination occurs, the vapor pressure causes a separation between the components material interfaces in its attempt to escape. For various reasons, the mechanical separation of interfaces has a lower release level thus the physical damage to the electrical interconnects within the package is minimal. Therein lies the problem—the IC leadframe package functions properly after assembly but now contains pathways by which moisture can enter the package, which can ultimately result in corrosion, metal migration, and other electrical problems, and eventually end with device failure. Environmental factors such as temperature, humidity levels, and atmospheric contaminants also play a role in determining when the component will fail. This long term reliability issue can prove quite costly when a device fails in the field and requires PCBA replacement, failure analysis, customer dissatisfaction, and other negative consequences.

Both popcorning and delamination are defects in IC leadframe packages but their respective effect on the packages can vary significantly. Assembly techniques and choices of materials play a role in determining the severity and frequency of the popcorning or delamination.

In addition, many manufacturers are requiring that IC leadframe components pass the JEDEC MSL-1 test criteria. MSL is an acronym for moisture sensitivity level and has eight different levels, MSL-1 being the highest performance level, and meaning that the package is immune to popcorning, regardless of exposure to moisture. JEDEC is an organization that develops and sets test, measurement, and performance standards for the component industry, and the various classifications used to determine a component's MSL correlate with end use and customer requirements.

Thus, one important aspect of packaged integrated circuits is their MSL, which reflects the degree to which the integrated circuits resist moisture induced stresses that can cause failure. The MSL of a packaged interconnect depends in part on the quality of the seal at the interface between the plastic encapsulating mold compound and the metallic leads that extend from the package.

One area that IC leadframe manufacturers have focused on is the interfacial bond between the metal surfaces of the leadframe and the plastic encapsulating mold material used in the devices. This interface is a common area of failure during assembly because moisture in the package is superheated during reflow.

Various adhesion promoting compositions have been developed that enhance the bond between the metal leadframe and the plastic encapsulating mold material.

However, it is has been found that when these adhesion promoting compositions are used with certain copper alloys, such as those having a high iron content, the iron content in the working bath rises, which then causes a significant increase in decomposition of certain components present in the bath which limits the useful working life of the bath. Thus, it would be desirable to improve the stability of such adhesion promoting compositions to avoid these problems.

SUMMARY OF THE INVENTION

It is an object of the present invention to prevent popcorning and delamination of a moisture sensitive device.

It is another object of the present invention to prevent popcorning and delamination of a moisture sensitive device that contains lead-free plating materials.

It is still another object of the present invention to provide an improved adhesion promoting composition for copper and copper alloy substrates.

It is still another object of the present invention to provide a stable adhesion promoting composition for various copper alloy substrates.

To that end, in a preferred embodiment, the present invention relates generally to a process for improving the adhesion of polymeric materials to metal surfaces, particularly copper and copper alloy surfaces, the method comprising the steps of:

1) Contacting the metal surface with an adhesion-promoting composition comprising:
   a) an oxidizer;
   b) an acid;
   c) a corrosion inhibitor; and
   d) an organic phosphonate; and
2) thereafter bonding the polymeric material to the metal surface.

The inventor has found that the foregoing process improves the adhesion of metal surfaces to the polymeric materials, particularly when the metal surfaces comprise copper or copper alloys. The process proposed is particularly suited to the production of silicon semiconductor integrated circuits and similar microelectronic circuits that require a package that both encases the circuit and provides an electrical interconnection to external circuitry.

DETAILED DESCRIPTION OF THE INVENTION

The present invention relates generally to an improved adhesion promoting composition for use in the leadframe industry for microroughening metal leadframes prior to bonding the leadframe with a plastic encapsulating mold material. The adhesion promoting compositions described herein are usable in the leadframe industry to roughen copper and copper alloy substrates, which then enhances the adhesion of the subsequently applied die attach resin or other polymeric material to the leadframe. Examples of suitable copper alloys include, but are not limited to, C194 alloy (available from Olin Corporation) and C7025 alloy (available from Fisk Alloy Conductors, Inc.)

C194 is a high performance copper alloy used for a variety of applications including automotive and electrical connectors, semiconductor leadframes, sockets, and mass terminations and combines good electrical and thermal conductivity with high strength, good solderability, and plateability. C194 has a nominal composition of 2.4% iron, 0.03% phosphorus, and 0.1% Zinc, with the balance copper.

Alloy C7025 (available from Fisk Alloy Conductors, Inc.) is a high performance alloy that combines strength, conductivity, formability and stress relaxation resistance into a unique set of properties. The alloy is a thermally aged material and achieves its properties by combinations of cold work and heat treatments, all of which is done at the mill. The alloy's high strength and conductivity combined with its formability and stress relaxation properties make C7025 an excellent electronic alloy, particularly in high temperature environments.

The present invention relates generally to a chemical microroughening process for enhancing the bond of leadframes to a subsequently applied die attach resin or other resinous or polymeric material used in IC manufacturing, thereby improving the MSL performance of the integrated circuit packages utilizing leadframes with lead-free plating materials. The process proposed herein provides optimum adhesion between the metallic and polymeric surfaces.

By virtue of the thermally resistant coating that is applied during the process, the substrate oxidation which would normally occur and that would adversely affect resin adhesion is prevented from occurring during the thermal curing of the die attach resin.

The performance target is moisture sensitivity level 1 (MSL-1) which, as discussed above, essentially means that the treated component should retain good adhesion even under high humidity conditions which would normally allow water ingress between the die attach resin and the substrate, causing failure (i.e., popcorning or delamination).

In a preferred embodiment, the adhesion promoting composition of the present invention is usable for microroughening a leadframe comprising C194 or other similar alloy, which have a high iron content. During use of adhesion promoting compositions of the prior art, it was found that the iron content in the working bath rises, which then causes a significant increase in decomposition of the peroxide and organic components present in the bath (via Fenton's reaction). This in turn severely limits the useful working life of the bath and/or necessitates an unacceptably high add back regime for successful maintenance. Other issues include organic sludge production which introduces obvious application issues.

The inventors of the present invention have found that the addition of various organic phosphonates to the adhesion promoting composition overcomes these noted deficiencies.

More specifically, the present invention relates generally to an adhesion promoting composition for treating a copper or copper alloy substrate, the adhesion promoting composition comprising:
   a) an oxidizer;
   b) an acid;

c) a corrosion inhibitor;
d) an organic phosphonate;
e) optionally, a source of halide ions;
f) optionally, adhesion enhancing species, which species are selected from the group consisting of molybdates, tungstates, tantalates, niobates, vanadates, isopoly or heteropoly acids of molybdenum, tungsten, tantalum, niobium, vanadium, and combinations of any of the foregoing; and
g) optionally, a water soluble polymer.

The inventor herein has found that the adhesion between a metal surface and a polymeric material is enhanced by contacting the metal surface with the adhesion-promoting composition prior to bonding the polymeric material to the metal surface.

The present invention also relates generally to a process for increasing the adhesion of a polymeric material to a metal surface, said process comprising:

1) contacting the metal surface with an adhesion-promoting composition comprising:
   a) an oxidizer;
   b) an acid;
   c) a corrosion inhibitor;
   d) an organic phosphonate;
   e) optionally, a source of halide ions;
   f) optionally, adhesion enhancing species, which species are selected from the group consisting of molybdates, tungstates, tantalates, niobates, vanadates, isopoly or heteropoly acids of molybdenum, tungsten, tantalum, niobium, vanadium, and combinations of any of the foregoing; and
   g) optionally, a water soluble polymer; and
2) thereafter bonding the polymeric material to the metal surface.

The inventor has found that the proposed adhesion-promoting composition produces an improved micro-roughened conversion-coated surface upon the metal. The surface produced is particularly suited to bonding with polymeric materials in that significantly increased adhesion values are achieved as compared to a non-treated metal surface. In addition the conversion coated (treated) metal surface maintains the increased adhesion over time and decreases the likelihood of any unwanted reactions occurring over time between the metal and the polymeric material.

The process proposed is particularly suited to the manufacture of semiconductor integrated circuits. Thus, in this application, the metal leadframe (usually copper or copper alloy) is first cleaned with an alkaline cleaner to remove dirt and oil. Thereafter, the cleaned leadframe is treated with the adhesion-promoting composition proposed herein. After treatment, followed by water rinsing and drying, the leadframe is bonded together with polymeric materials such as a die attach resin or other polymeric material used in IC manufacturing.

The metal surface to be treated may comprise a variety of metals such as copper, copper alloys, nickel and iron. However, the process of the invention produces the best results when the metal surfaces comprise copper or copper alloys. The process of the invention is particularly suited to copper alloys that contain iron such as the C194 and other alloys having a high iron content.

Polymeric materials include polymeric mold materials which are typically thermosettable plastic compounds including, for example, novolac, anhydride, biphenyl, and multiaromatic resins, by way of example and not limitation. The process described herein has been found to improve the moisture sensitivity as well as the MSL of integrated circuit packages made of these mold compounds.

The oxidizer used in the adhesion-promoting composition may comprise any oxidizer which is capable of oxidizing the metal surface in the matrix of the adhesion-promoting composition. The inventors have found hydrogen peroxide and persulfates to be particularly preferred oxidizers for use in the process of the invention, with hydrogen peroxide being the most preferred oxidizer. The concentration of the oxidizer in the adhesion-promoting composition may range from 0.5 to 120 grams per liter but is preferably from 2 to 60 grams per liter and is most preferably from 3 to 30 grams per liter.

The acid utilized in the adhesion-promoting composition may be any acid which is stable in the matrix, however, the inventors have found mineral acids to be particularly preferred. Sulfuric acid is especially preferred. The concentration of the acid in the adhesion-promoting composition may range from 1 to 360 grams per liter but is preferably from 20 to 110 grams per liter.

The corrosion inhibitor used in the adhesion-promoting composition is a compound which effectively reacts with the metal surface to form a protective complex layer. Preferred corrosion inhibitors are selected from the group consisting of triazoles, benzotriazoles, tetrazoles, imidazoles, benzimidazoles and mixtures of the foregoing. Benzotriazoles are particularly preferred. The concentration of the corrosion inhibitor in the adhesion-promoting composition may range from 0.1 to 50 grams per liter but is preferably from 0.2 to 5 grams per liter.

The composition also comprises an organic phosphonate. The inventors of the present invention have found that the use of an organic phosphonate in the composition stabilizes the oxidizer and organic components present in the bath and prevents decomposition of the components. This in turn increases the working life of the bath and alleviates organic sludge production. Suitable organic phosphonates include 1-hydroxy-1,1-ethylidene diphosphonate commercially available as DEQUEST 2010 (available from Thermphos International) as well as further similar phosphonate compounds. By way of non-limiting example further useful peroxide stabilizers include: amino tri (methylene-phosphonic acid) available as DEQUEST 2000 and DEQUEST 2000LC; amino tri (methylene-phosphonic acid) pentasodium salt available as DEQUEST 2006; 1-hydroxyethylene-1,1,-diphosphonic acid commercially available as DEQUEST 2010; 1-hydroxyethylene-1,1,-diphosphonic acid tetrasodium salt available as DEQUEST 2016 and DEQUEST 2016D; ethylene diamine tetra(methylene phosphonic acid) available as DEQUEST 2041; ethylene diamine tetra(methylene phosphonic acid) pentasodium salt available as DEQUEST 2046; hexamethylenediamine tetra(methylene phosphonic acid) potassium salt available as DEQUEST 2054; diethylenetriamine penta(methylene phosphonic acid) available as DEQUEST 2060S; diethylenetriamine penta (methylenephosphonic acid) trisodium salt available as DEQUEST 2066A; diethylenetriamine penta (methylene-phosphonic acid) pentasodium salt available as DEQUEST 2066; diethylenetriamine penta(methylene phosphonic acid) pentasodium salt commercially available as DEQUEST 2066C2; bis-hexamethylene triaminepenta(methylenephosphonic acid) chloride salt commercially available as DEQUEST 2090A 2-phosphonobutane-1,2,4-tricarboxylic acid commercially available as DEQUEST 7000, tetrasodium salt of 1-hydroxy ethyliden (1,1-diphosphonic acid) commercially available as DEQUEST SPE 9528, as well as other materials sold under the DEQUEST tradename, particularly DEQUEST 2086, DEQUEST 3000S, as well as DEQUEST 6004 (all available from Thermphos International).

The organic phosphonate is typically present in the composition at a concentration of between about 0.1 to 120 grams per liter, more preferably at a concentration of between about 0.1 to 50 grams per liter. Preferably the organic phosphonate is 1-hydroxy-1,1-ethylidene diphosphonate, which is present in the composition at a concentration of between about 0.1 to 120 grams per liter, more preferably at a concentration of between about 3 to 30 grams per liter.

Optionally, the composition may also include a source of adhesion enhancing species, which can be any material that will supply species selected from the group consisting of molybdates, tungstates, tantalates, niobates, vanadates and mixtures thereof to the adhesion promoting composition. Such sources include alkali metal salts of molybdates, tungstates, tantalates, niobates, vanadates and mixtures thereof such as sodium (or potassium) molybdate, tungstate, niobate or vanadate, and heteropoly acids or isopoly acids of molybdenum, tungsten, tantalum, niobium or vanadium. Thus, molybdates or tungstates which include heteroatoms such as phosphorous, silicon, cobalt, manganese and tungsten are suitable. Preferred sources include iso and hetero polyacids of molybdenum, tungsten, niobium, vanadium and mixtures thereof such as molybdic acid, vanadic acid and tungstic acid. The most preferred source of adhesion enhancing species is molybdic acid. The concentration of adhesion enhancing species in the adhesion promoting composition may range from 1 mg/l to 500 mg/l (based on the adhesion enhancing ion content) but is preferably from 5 mg/l to 200 mg/l. The adhesion-enhancing species may be utilized with or without the benzotriazole with the electron withdrawing group in the 1-position.

Optionally, the adhesion-promoting composition may also comprise a water soluble polymer. If used, the water soluble polymer is preferably not a wetter or surfactant but is instead a water soluble homopolymer or copolymer of low molecular weight water soluble monomers. Most preferably, the water soluble polymer is a polymer of ethylene oxide, an ethylene oxide-propylene oxide copolymer, polyethylene glycols, polypropylene glycols or polyvinyl alcohols. Among the most preferred are the polymers of ethylene oxide, or polyethylene glycols sold by the Union Carbide Company under the tradename Carbowax. The inventors have found Carbowax 750 and Carbowax MPEG 2000 to be particularly useful. Also particularly useful are the ethylene oxide polymers or ethylene oxide-propylene oxide copolymers sold by the BASF or Company under the Pluronic tradename. The concentration of the water soluble polymer in the adhesion-promoting composition can range from 0.2 to 15 grams per liter, but is preferably from 3 to 6 grams per liter.

The adhesion promoting composition also optionally, but preferably, contains a source of halide ions. The source of halide ions may be any compound which would provide halide ions in the matrix of the adhesion-promoting composition. Preferably, the source of halide ions are alkaline metal salts such as sodium chloride or potassium chloride, oxohalides such as sodium chlorate or potassium chlorate, or halide bearing mineral acids such as hydrochloric acid. Preferably the source of halide ions provides chloride ions to the adhesion-promoting composition. The concentration of the source of halide ions in the adhesion-promoting composition may range from 0.5 to 500 milligrams per liter but is preferably from 1 to 12 milligrams per liter, all based on halide ion content.

The metal leadframe can be treated with the adhesion-promoting composition of the composition in a variety of ways, including immersion, spray, or flood. The temperature of the adhesion-promoting composition during treatment may range from 80° F. to 150° F. but is preferably from 90° F. to 120° F. The treatment time will vary depending upon the temperature and method of treatment but may range from 15 seconds to 15 minutes and is preferably from 1 to 2 minutes.

The inventors have found that the use of the improved bath composition described herein provides an improved bond between the copper leadframe and the die attach resin or other polymeric material and at least substantially eliminates popcorning and delamination of the IC device.

What is claimed is:

1. An adhesion promoting composition useful in treating metal surfaces prior to bonding polymeric materials to the metal surfaces, the adhesion promoting composition comprising:
    a) an oxidizer;
    b) an inorganic acid;
    c) a corrosion inhibitor; and
    d) an organic phosphonate selected from the group consisting of 1-hydroxy-1,1-ethylidene diphosphonate, amino tri(methylene-phosphonic acid), amino tri (methylene-phosphonic acid)pentasodium salt, 1-hydroxyethylene-1,1-diphosphonic acid, 1-hydroxyethylene-1,1-diphosphonic acid tetrasodium salt, ethylene diamine tetra (methylene phosphonic acid), ethylene diamine tetra (methylene phosphonic acid) pentasodium salt, hexamethylenediamine tetra(methylene phosphonic acid) potassium salt diethylenetriamine penta(methylene phosphonic acid), diethylenetriamine penta(methylenephosphonic acid) trisodium salt, diethylenetriamine penta (methylenephosphonic acid) pentasodium salt, diethlenetriamine penta(methylene phosphonic acid) pentasodium salt; bis-hexamethylene triaminepenta ((methylenephoshonic acid) chloride salt, 2-phosphonobutane-1,2,4-tricarboxylic acid, tetrasodium salt of 1-hydroxy ethylidene (1,1-diphosphonic acid) and combination of one or more of the foregoing.

2. The adhesion promoting composition according to claim 1, wherein the oxidizer is hydrogen peroxide.

3. The adhesion promoting composition according to claim 1, wherein the inorganic acid is a mineral acid.

4. The adhesion promoting composition according to claim 3, wherein the mineral acid is sulfuric acid.

5. The adhesion promoting composition according to claim 1, wherein the corrosion inhibitor is selected from the group consisting of triazoles, benzotriazoles, tetrazoles, imidazoles, benzimidazoles and combinations of one or more of the foregoing.

6. The adhesion promoting composition according to claim 5, wherein the corrosion inhibitor is a benzotriazole.

7. The adhesion promoting composition according to claim 1, wherein the organic phosphonate is 1-hydroxy-1,1-ethylidene diphosphonate.

8. The adhesion promoting composition according to claim 1, wherein the organic phosphonate is present in the composition at a concentration of between about 0.1 to 120 grams per liter.

9. The adhesion promoting composition according to claim 7, wherein the 1-hydroxy-1,1-ethylidene diphosphonate is present in the composition at a concentration of between about 0.1 to 120 grams per liter.

* * * * *